United States Patent
Chen

(10) Patent No.: US 7,928,591 B2
(45) Date of Patent: Apr. 19, 2011

(54) APPARATUS AND METHOD FOR PREDETERMINED COMPONENT PLACEMENT TO A TARGET PLATFORM

(75) Inventor: Kong-Chen Chen, San Jose, CA (US)

(73) Assignee: Wintec Industries, Inc., Milpitas, CA (US)

( * ) Notice: Subject to any disclaimer, the term of this patent is extended or adjusted under 35 U.S.C. 154(b) by 843 days.

(21) Appl. No.: 11/351,418

(22) Filed: Feb. 10, 2006

(65) Prior Publication Data

US 2006/0202359 A1   Sep. 14, 2006

Related U.S. Application Data

(60) Provisional application No. 60/652,217, filed on Feb. 11, 2005.

(51) Int. Cl.
H01L 23/544 (2006.01)
(52) U.S. Cl. .................................. 257/797; 257/48
(58) Field of Classification Search .................. 257/797, 257/E23.179, 48, 15, FOR. 101, FOR. 102, 257/FOR. 142, E21.521–E21.531, 666–773
See application file for complete search history.

(56) References Cited

U.S. PATENT DOCUMENTS

| | | | |
|---|---|---|---|
| 5,489,749 A | 2/1996 | DiStefano et al. | |
| 6,081,040 A * | 6/2000 | Okuda et al. | 257/797 |
| 6,137,063 A | 10/2000 | Jiang | |
| 6,288,426 B1 | 9/2001 | Gauthier et al. | |
| 6,474,997 B1 | 11/2002 | Ochiai | |
| 6,548,827 B2 | 4/2003 | Irie | |
| 6,579,430 B2 | 6/2003 | Davis et al. | |
| 6,775,153 B2 | 8/2004 | Hashimoto | |
| 6,914,259 B2 | 7/2005 | Sakiyama et al. | |
| 7,022,919 B2 | 4/2006 | Brist et al. | |
| 7,077,659 B2 * | 7/2006 | Weiss et al. | 439/66 |
| 7,402,897 B2 | 7/2008 | Leedy | |
| 7,456,497 B2 | 11/2008 | Higashi | |
| 7,633,147 B2 | 12/2009 | Funaba et al. | |
| 2002/0191835 A1 | 12/2002 | Lu et al. | |
| 2003/0085461 A1 | 5/2003 | Sakiyama et al. | |
| 2003/0181071 A1 | 9/2003 | Weiss et al. | |
| 2004/0196682 A1 | 10/2004 | Funaba et al. | |
| 2004/0262036 A1 | 12/2004 | Brist et al. | |

(Continued)

FOREIGN PATENT DOCUMENTS

CN   1343007 A   4/2002

(Continued)

OTHER PUBLICATIONS

Machine translation of JP 2005-217071 has been attached.*

(Continued)

*Primary Examiner* — Wai-Sing Louie
*Assistant Examiner* — Bilkis Jahan
(74) *Attorney, Agent, or Firm* — Kilpatrick Townsend and Stockton LLP

(57) ABSTRACT

The present invention relates generally to assembly techniques. According to the present invention, the alignment and probing techniques to improve the accuracy of component placement in assembly are described. More particularly, the invention includes methods and structures to detect and improve the component placement accuracy on a target platform by incorporating alignment marks on component and reference marks on target platform under various probing techniques. A set of sensors grouped in any array to form a multiple-sensor probe can detect the deviation of displaced components in assembly.

16 Claims, 11 Drawing Sheets

U.S. PATENT DOCUMENTS

| | | |
|---|---|---|
| 2005/0167795 A1 | 8/2005 | Higashi |
| 2006/0115927 A1 | 6/2006 | Yeo et al. |
| 2007/0020812 A1 | 1/2007 | Hsu et al. |
| 2007/0187844 A1 | 8/2007 | Chen |

FOREIGN PATENT DOCUMENTS

| | | | |
|---|---|---|---|
| CN | 1420557 A | | 5/2003 |
| GB | 2412790 A | | 5/2005 |
| JP | 2005217071 | * | 8/2005 |
| WO | 2007095100 A2 | | 8/2007 |

OTHER PUBLICATIONS

Examination Report for GB Patent Application No. GB0803726.9, mailed on Sep. 28, 2010, 3 pages.

Substantive Examination Adverse Report for Malaysia Patent Application No. PI 20080463, mailed on Jun. 30, 2010, 3 pages.

Office Action for U.S. Appl. No. 11/593,788, mailed on Jun. 23, 2010, 16 pages.

Office Action of Chinese Application No. 200780001159.3, dated Mar. 24, 2010, 27 pages total.

Office Action of Chinese Application No. 200780001159.3, dated Sep. 11, 2009, 14 pages total.

Office Action for U.S. Appl. No. 11/593,788, mailed on Jun. 4, 2009, 13 pages.

Requirement for Restriction/Election for U.S. Appl. No. 11/593,788, mailed on Feb. 25, 2009, 10 pages.

Final Office Action for U.S. Appl. No. 11/593,788, mailed on Feb. 4, 2010, 18 pages.

PCT International Search Report of PCT Application No. PCT/US 07/03519, dated Nov. 28, 2007, 12 pages.

Final Office Action for U.S. Appl. No. 11/593,788, mailed on Dec. 7, 2010, 16 pages.

* cited by examiner

Perfect package outline

Ideal grid location determined from package outline

Offset from ideal grid location

APPARATUS AND METHOD FOR PREDETERMINED COMPONENT PLACEMENT TO A TARGET PLATFORM

CROSS-REFERENCES TO RELATED APPLICATION

This application claims priority to Provisional Application No. 60/652,217 filed Feb. 11, 2005 and incorporated by reference herein for all purposes.

BACKGROUND OF THE INVENTION

The present invention relates generally to assembly techniques. The alignment and probing techniques to improve the accuracy of component placement in assembly are described. More particularly, the invention includes methods and structures to detect and improve the component placement accuracy on a target platform by incorporating alignment marks on component and reference marks on target platform with various probing techniques. A set of sensors grouped in an array to form a multiple-sensor probe can detect the deviation of displaced components in assembly. Merely by way of example, the invention has been applied to placing packaged devices onto electronic substrates for the manufacture of electronic systems. But it would be recognized that the invention has a much broader range of applicability.

Electronic devices have proliferated over the years. As the complexity and the operation speed of integrated circuits (IC) increase, it is not unusual to see an increasing number of devices with pin-counts exceeding hundreds or even a thousand. For example, a high-speed design requires more power and ground pins. The differential pairs are replacing the single-end signals at the input and output pins (I/O) of a device to meet the signal integrity requirements. In addition, as system-on-a-chip becomes a reality, more and more pins are added to the device I/O to supports more functions. In generally, many if not all of these tend to increase the number of pins in a packaged device or component.

As the device pin-count increases, the pin pitch of the device tends to decrease to limit the outgrowth of package size. The reduced pin-pitch poses a challenge for the placement equipment to place components accurately on target platform, such as a printed circuit board (PCB), especially if the pin pitch is smaller than 0.5 mm.

The conventional surface-mount equipment uses the Cartesian coordinates at the center of target land pattern as reference point to place a component on PCB. There is no feedback to monitor the accuracy of component placement. Without proper feedback, the accuracy of component placement is uncertain. Actually, the accuracy of component placement is influenced by the imperfectness in package outline, the deviation of component's contact array from ideal grid location, the imperfectness in PCB mounting references, the aging and the intrinsic tolerance of placement equipment, and so on. As the accumulative error is getting closer to the pitch size of contact array, placing a component accurately on PCB is a big challenge.

It is not uncommon to encounter component placement problem in surface mount assembly line, especially for the placement of fine-pitch components. For example, if a BGA component is inaccurately placed on PCB, it could cause the BGA's contact array to deviate from the idea land pattern location, resulting in either inadequate soldering or solder bridging to adjacent pads on PCB. A rework to fix these problems are tedious and expensive. It is even worse for the rework of a pricy, high pin-count component on a high density PCB.

Also, manufacturers frequently use sockets to house high-end, high pin count chips on motherboard. It enables user to choose proper speed grade component or to perform speed upgrade at field. However, there is no handy method for users or manufacturers to monitor if a chip has been properly inserted in the socket or if the chip is in good contact with the receptacle inside the socket.

It is seen that techniques for detecting and improving component placement accuracy and for detecting the contact status are desirable.

BRIEF SUMMARY OF THE INVENTION

The present invention relates in general to assembly techniques. According to the present invention, the alignment and probing techniques to improve the accuracy of component placement in assembly are described. More particularly, the invention includes methods and structures to detect and improve the component placement accuracy on a target platform by incorporating alignment marks on component and reference marks on target platform with various probing techniques. A set of sensors grouped in an array to form a multiple-sensor probe is used to detect the deviation of displaced components on target platform. Merely by way of example, the invention has been applied to placing components onto electronic substrates for the manufacture of electronic systems. But it would be recognized that the invention has a much broader range of applicability, such the precision alignment of a set of different objects.

In a specific embodiment, the present invention provides solution for IC or packaged device with a set of one or more alignment marks in predetermined spatial regions on the IC or packaged device. Depending on the embodiments, the packaged device, containing a plurality of I/O contacts, can be an integrated circuit device encapsulated in a suitable material, such as plastic (e.g., epoxy), ceramic (e.g., aluminum dioxide) or other materials, and a plurality of bonding pads connected to its I/O contacts. The packaged device can be a multiple-IC stacked device, multiple-package stacked device, or multiple-chip carrier. The packaged device can also be an integrated circuit device laminated with an anisotropic conductive elastomer (ACE) membrane as interconnect interface for external connections, and so on. The set of alignment marks monitor the placement of such packaged device on target substrate or platform to determine if the plurality of external contacts on device are accurately placed at land pattern on target substrate or platform, such as printed circuit board, mother board, ceramic board, bare die IC, or other packaged device or component. If the packaged device is inaccurately placed, the alignment mark can also be used to obtain feedback to adjust the device position deviation. For simplicity, the ICs and packaged devices are called as components.

In a specific embodiment, an alignment mark is a reference area on component that an external probe can use it to monitor the accuracy of component placement on a target platform. The alignment mark incorporated on component can be a conduction path connecting the surface areas from top to bottom on component as a direct alignment mark, or it can be a different conduction path connecting two surface areas at the bottom of component as an indirect alignment mark. Besides being a conduction path within the component, the alignment mark can also be a simple surface marking on component, depending upon the probing method used. The structure of an alignment mark can be a simple geometric structure or a set of geometric structures.

For each alignment mark on component, a reference mark can be added to target platform for the component placement to refer to. In a specific embodiment, the present invention provides solution for target substrate or platform, such as printed-circuit board, mother board, ceramic board, bare die IC, or other packaged device or component, by incorporating a set of one or more reference marks at pre-determined regions for the component placement to refer to. The reference mark can be connected to other reference marks on same target platform with a conduction path. It can be connected to a ground point in a target platform, or it can simply be a surface marking on the target platform, depending upon the probing method used.

In preferred embodiments, the present invention provides probe solutions for improving the accuracy in component placement. The probe can be a single-sensor probe or can be an array of sensors. A single-sensor probe can detect the accuracy of component placement and the status of component contact condition on target platform. A probe composing of an array of sensors to become a multiple-sensor probe can adjust the deviation of displaced component by aligning the one or more alignment marks on component to the probe position that has been aligned to a reference mark. A multiple sensor probe can detect the deviation of component and feedback the information to the placement equipment to fix the position deviation. While a single alignment mark can fix the component displacement error, two alignment marks can fix the placement orientation error. The probe can be a resistance probe, a capacitance probe, an optical probe, or a combination of them. The resistance probe is for on/off measurement, the capacitance probe is for measuring the relative area overlapping between sensor surface and target reference, and the optical probe is for measuring the reflection from a target reference. The resistance probe is a contact probe. The capacitance probe and optical probe is a non-contact probe. The range of active sensors on the multiple-sensor probe can be determined automatically by sensing the size of target reference mark.

In a specific embodiment, the present invention provides method for aligning component on target platform under various probing techniques.

The method includes placing a component containing one or more alignment marks to a region on target platform. The region on target platform contains a target structure and a set of reference marks to be monitored by probe to determine whether or not the component has accurately been placed on the target structure. On PCB, the target structure is a component land pattern. For each alignment mark on component, a corresponding reference mark can be included on target land pattern. The spatial relationship of the alignment marking at the top to the contact array at the bottom of component should match the spatial relationship of reference marking with respect to contact array on land pattern. The method also includes the way to align the multiple-sensor probe on target land pattern, to determine the active range of the set of multiple sensors, and to adjust the component position with respect to an aligned probe.

Since the spatial relationship of alignment marks to the associated contact array can be accurately controlled in the device fabrication or component packaging process, a fixed spatial relationship between the alignment mark and the contact array on device or package can be ensured. This allows a package with minor obliquity in physical outline (an oblique package) or a bare die not perfectly centered-cut along the scribing line between adjacent dies (off-center-cut die) can still be used for assembly. This is because in assembly the component placement can then rely on the position of alignment marks, rather than counting on the geometrical tolerance of the package outline. In a specific embodiment, the present invention provides a method for mounting a physically out of specification device or package on a prospective contact region on PCB or target platform. The physically out of specification devices used to causing misalignment problem in assembly could no longer be rejected. A larger tolerance in the die cutting of device or in the molding of component package means a higher component yield.

Many benefits can be achieved by way of the present invention over conventional techniques. The present technique provides an easy to use process that relies upon the conventional technology. In some embodiments, the method provides a mean to improve yields, reduce rework, and enhance placement accuracy. Additionally, the method provides a process that is compatible with the conventional process technology without substantial modifications to the conventional equipment and processes. The present invention is especially useful for the devices with ultra-fine contact pitch and contact count exceeding hundreds or even a thousand.

Moreover, the invention provides a method for monitoring the placement of devices packaged with anisotropic conductive elastomer (ACE) as interconnect interface. It enables the assembly of non-solder-ball based packaged devices onto target platform or PCB effectively and precisely and thereon for a variety of applications. The anisotropic conductive elastomer contains a sea of tiny conducting metal tubes embedded in elastic insulating silicone membrane that conducts current only in certain direction. It has been used as interconnect in high density and high pin count test sockets to offer excellent contact, repeatability, and high frequency characteristics in IC device test. It is feasible to be as the interface interconnect for devices and packages. A device or component laminated with ACE can be directly mounted onto a target substrate. A clamp shell can be used to hold the devices together without the need of soldering the devices on target substrate if an accurate placement technology is achievable. The alignment technique can make the assembly of ACE laminated devices on electronics system feasible.

Depending upon the embodiment, one or more of these benefits can be achieved and will be described in more detail throughout the present specification. Various additional objects, features and advantages of the present invention can be more fully appreciated with reference to the detailed description and accompanying drawings that follow.

BRIEF DESCRIPTION OF THE DRAWINGS

FIG. 10 illustrates the use of three sets of latches to align a small alignment mark to the center of a large reference mark. The third digit in the tuple indicates the effective range of active test points for a smaller alignment mark to align to.

DETAILED DESCRIPTION OF THE INVENTION

Figure 1A:
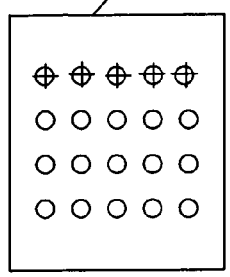
FIG. 1A is an example of ideal package.

According to the present invention, the alignment and probing techniques to improve the component placement accuracy in assembly are described. More particularly, the invention includes methods and structures to detect and improve the component placement accuracy on a target platform by incorporating alignment marks on component and reference marks on target platform with various probing techniques. A set of sensors grouped in an array to form a multiple-sensor probe can detect the deviation of displaced components in assembly. Merely by way of example, the invention has been applied to placing packaged semiconductor devices onto electronic substrates for the manufacture of electronic systems. But it would be recognized that the invention has a much broader range of applicability. Further details of the present invention can be found throughout the present specification and more particularly below.

Alignment Mark

According to preferred embodiments, an alignment mark is a reference region on component that an external probe can use it to monitor the accuracy of component placement on a target platform. The alignment mark incorporated on component can be a conduction path connecting the surface areas from top to bottom on component as a direct alignment mark, or it can be a different conduction path connecting two surface areas at the bottom of component as an indirect alignment mark. Although the top-down conduction path does not need to be a straight path, a straight path from top to bottom or a matching top and bottom location on component is easier to visualize the position of bottom contact point associated with the alignment mark. The surface area of the conduction path at bottom can be either the contact point on the contact array or a different access point. Besides being a conduction path within the component, the alignment mark can also be a simple surface marking on component, depending upon the probing method used. The structure of an alignment mark can be a simple geometric structure or a set of geometric structures.

The alignment mark on component can be a single alignment mark or a set of alignment marks. Normally, one alignment mark is adequate. Second alignment mark is added to the component if the component size is large or may require orientation adjustment to improve the placement accuracy. The tangential deviation from the ideal land pattern for far-end contacts in a large component could be significant if there is an orientation error. For small component, the impact due to a minor orientation error is insignificant.

Depending upon the probing techniques, a probe can be either in direct contact or not in direct contact with the alignment mark when it is used to monitor the component placement accuracy. If a resistance probe is used to monitor the position of alignment mark, it requires a direct contact. If a capacitance probe is used to monitor the position of alignment mark, it does not require a direct contact. In both cases, the alignment mark is an electrical alignment mark because there is a conduction current flowing through the alignment mark, except one is a DC current and the other is an AC current. If an optical probe is used to monitor the reflection from the surface of alignment mark, then the alignment mark is an optical alignment mark. Thus, a reflective, conductive marking at the top surface of component can be used as an electrical alignment mark or as an optical alignment mark depending upon how the alignment mark is constructed and which probing technique is used.

Reference Mark

For each alignment mark on component, a corresponding reference mark can be added to the target platform for component placement to refer to. The spatial relationship of alignment mark to the contact array on component should match the spatial relationship of reference mark to the associated land pattern on target platform. The reference mark can be part of the component contact land pattern on target platform. Depending upon the probing technique and the application requirements, the reference mark may or may not need to make a direct contact with the bottom of alignment mark. In a special case if the reference mark is simply a surface marking on target platform and if the alignment marking is also a simple surface marking, the then the top position of alignment marking at component can be chosen in such way that it matches the center point or one of the corner points of contact array on land pattern to eliminate the need of additional reference mark on target platform.

Uncertainty in Component Placement

One useful aspect of current alignment techniques is that the placement accuracy no longer relies on the component physical outline, nor does it rely on the grid accuracy of contact array from the edges of component. For example, if the molding process causes a minor obliquity in the finished package such that the contact array on package is not perfectly in parallel with the edge of the package (an oblique package), it is difficult to place the package correctly on land pattern under conventional technology, especially when the package size is large and the array pitch size is small; nor for a package with its contact-array shifted from the ideal grid location (an off-grid package). Conventional placement equipment uses the Cartesian coordinates at the center of land pattern as a reference point to place component on it, based on the assumption that the component physical outline is perfect and its contact array is precisely located from all edges of component per package mechanical specifications.

Figure 1B:
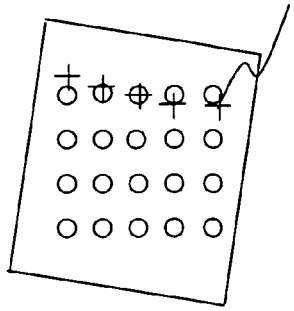
FIG. 1B is an example of oblique package.
Figure 1C:
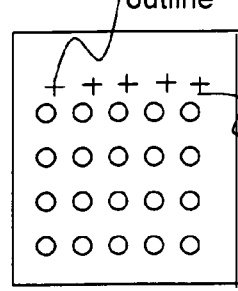
FIG. 1C is a different example of out-of-specification package with contact array off-grid.

FIG. 1A shows an example of ideal package. It has a perfect physical outline and all package contacts are on prescribed grid locations. FIG. 1B shows an example of oblique package, where the contact array is not in parallel with the package physical outline and is tilted from the ideal grid location as viewed from the package outline. FIG. 1C shows a different example of out of specification package where the contact array is not properly center-molded and thus bears an offset from ideal grid location as viewed from the package outline. The packages in FIG. 1B and FIG. 1C are out of physical specification and is difficult to use in conventional surface mount assembly. The imperfections in drawings are exaggerated to illustrate the concept.

Figure 2:
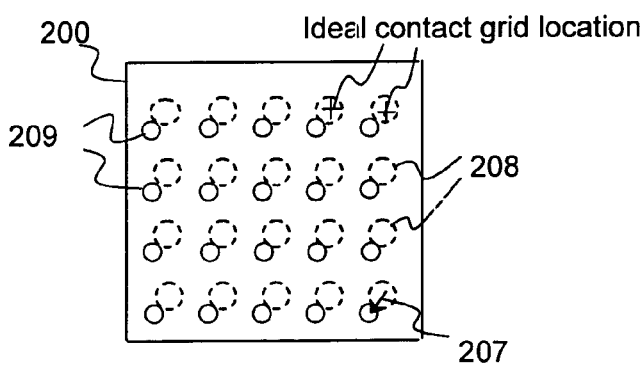
FIG. 2 shows the placement of an off-grid component on land pattern. All contacts on component are shifted by same offset from land pattern after placement.

FIG. 2 shows an example of placing an off-grid component 200 on target land pattern 208. As shown, the contact array 209 on component 200 suffers an offset 207 in the lower-left direction. All contacts on component 200 will have the same offset 207 from the target land pattern 208 after placement. This is different from the placement of an oblique package where the skew or offset at the corner contacts is larger than that at center.

Adding alignment marks to component could significantly reduce the adverse impacts due to the imperfection in the package outline and eliminate the contact position uncertainty caused by the deviation of contact array from its ideal grid location even if the package outline is still in spec. The alignment mark can be placed within or beyond the component's contact array. It is fabricated at a predetermined spatial relationship with respect to component's contact array, rather than at a location based on the component physical outline or the distance from the edge of package.

The alignment mark decouples the equipment's reliance on the ideal physical outline of components. Thus, some physically out of specification components that were scraped in production before, such as packages with minor obliquity in physical outline, packages with contact array deviated from ideal grid location, or bare dies not perfectly centered cut along the scribing line between adjacent dies, could become useable for system assembly. Further detail of the structure and the operation of alignment mark are described as follows. Certain methods and variations are also provided throughout the present specification.

Component Alignment Using Resistance Probe

In this embodiment, an alignment mark is an electrical conduction path incorporated in component or package at a pre-determined spatial location with respect to its contact array. The conduction path can be constructed from the top surface of component, where a test signal can be applied to, to the bottom surface of component, where a matching contact or reference pad on target platform can be connected underneath. The conduction path on component and the matching reference pad on target platform are paired to monitor the accuracy of component placement. If a component were accurately placed on target platform, the matching reference pad would appear underneath the bottom surface of the conduction path and a conduction current would be detected when a voltage were applied to the top surface of the component.

Figure 3:
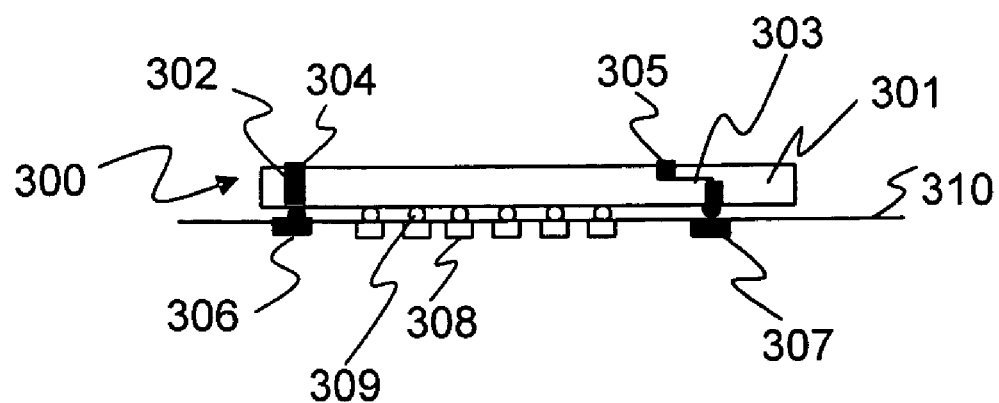
FIG. 3 illustrates the placement of component with a set of conduction paths on a target platform with matching land pattern and reference marks for checking the placement accuracy and contact condition.

FIG. 3 shows an example of placing a component 300 on target platform 310. The component 300 is an encapsulated package 301 with a plurality of external connections at contact array 309 and one or more conduction paths 302, 303 as alignment marks. On the target platform, a land pattern 308 and a set of reference pads 306, 307 are pre-fabricated. The reference pads 306, 307 would be underneath the bottom surface of conduction paths 302, 303 if the component 300 were aligned to land pattern 308. This diagram is merely an example, which should not unduly limit the scope of the claims herein. One of ordinary skill in the art would recognize many variations, modifications, and alternatives, such as the component can be a bare die with an embedded conduction path from top to bottom as an alignment mark, an integrated circuit encapsulated in plastic package or in ceramic material package with solder bumps, or a device laminated with a layer of ACE membrane for external interconnect but without solder bumps, or any combination of these, and the like.

The conduction path in component 300 can be a straight pipe or any irregular shape of conduction trace 303 running from top to bottom in component. One or more conduction paths can be incorporated in component. The external accessible points 304, 305 associated with the conduction paths 302, 303 can be a simple circular pad. Other pad shape, such as square, rectangular, triangle, trapezoid, or a combination of these, is likely. Resistance probe is placed on the external access points 304, 305 to monitor the status of placement accuracy. The conduction path can be a metal, a doped semiconductor path, or other detectable entity.

In FIG. 3, a set of reference pads 306, 307 is pre-fabricated on the target platform 310 as target reference to guide the component placement. The reference pad can be a simple circular pad, although other shape, such as square, rectangular, triangle, trapezoid, a set of ground dots, a combination of these, is also likely. The reference pads 306, 307 on target platform 310 are named as the "reference marks". For an alignment mark on component, a correspondent reference mark can be added to the target platform. The location of reference mark on target platform 310 is pre-fabricated in such a way that the spatial relationship between reference marks 306, 307 and land pattern 308 on target platform matches the spatial relationship between the bottom contact of alignment marks 302, 303 and the contact array 309 on component 300.

The size of reference mark is determined by the variance of the placement system, such as the imperfections in component outline, contact array, target platform, equipment precision, mechanical aging, and database rounding error, etc. A system with larger cumulative placement uncertainty requires a larger reference mark. The size of reference mark should be large enough that at each component initial placement the alignment mark should be at least partially within the boundary of target reference mark. The initial component placement is the placement based on the coordinates of reference mark or target land pattern stored in the placement database. In addition, the size of alignment mark is preferably same as or smaller than the size of reference mark, since it can impact the accuracy of component placement to be explained later.

Figure 4:
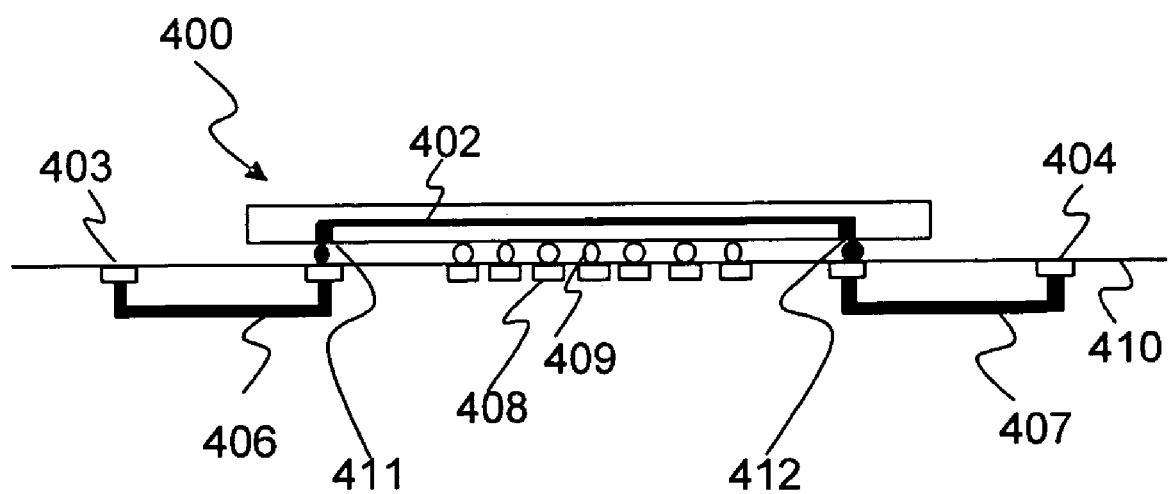
FIG. 4 shows a different configuration of alignment mark, where all test accessible points are at the same side as the contact array. It is simplified diagram of indirect alignment path and indirect alignment mark.

Besides a top-down structure, where one test point associated with the conduction path is at the top surface of component, it is also possible to have both test points 411, 412 at the same side as the contact array 409, as shown in FIG. 4. Two additional traces 406, 407 are added to the target platform 410 in this case to connect the test points 411, 412 associated with the conduction path to the external accessible points 403, 404 on target platform 410. The power and ground tips of a resistance probe can be applied to the two external accessible points 403, 404 to detect if there is a conduction current to determine if the component has been correctly placed on target land pattern 408. The conduction path with both test points located at the same side as contact array is named as an indirect alignment path. Its contact points are the indirect alignment marks.

If several indirect alignment paths on different components are connected into a serial daisy chain on target platform, it can be used to monitor the contact condition of all components in the chain or to check if all components are still in place when the system is in use. This is useful for electronic system assembled with solderless components, such as components using ACE as interconnect interface, where the indirect alignment paths for all ACE based components can be connected in a single alignment chain or several shorter chains. A supply voltage and detectors, such as LED diodes, can be connected to each chain to monitor the connection status of all solderless components in the chain.

Incorporating alignment marks on component not only can detect the accuracy of component placement on target platform, but also can fix the component position deviation after placement. However, it is the configuration of test probe and the handling of signals detected by test probe to determine the functions of alignment mark. While a single-test-point probe, namely a single-sensor probe, can detect the placement status and the interface contact condition, a multiple-test-point probe, namely a multiple-sensor probe, can detect the direction and the magnitude of deviation in component placement to be explained later.

Figure 5:
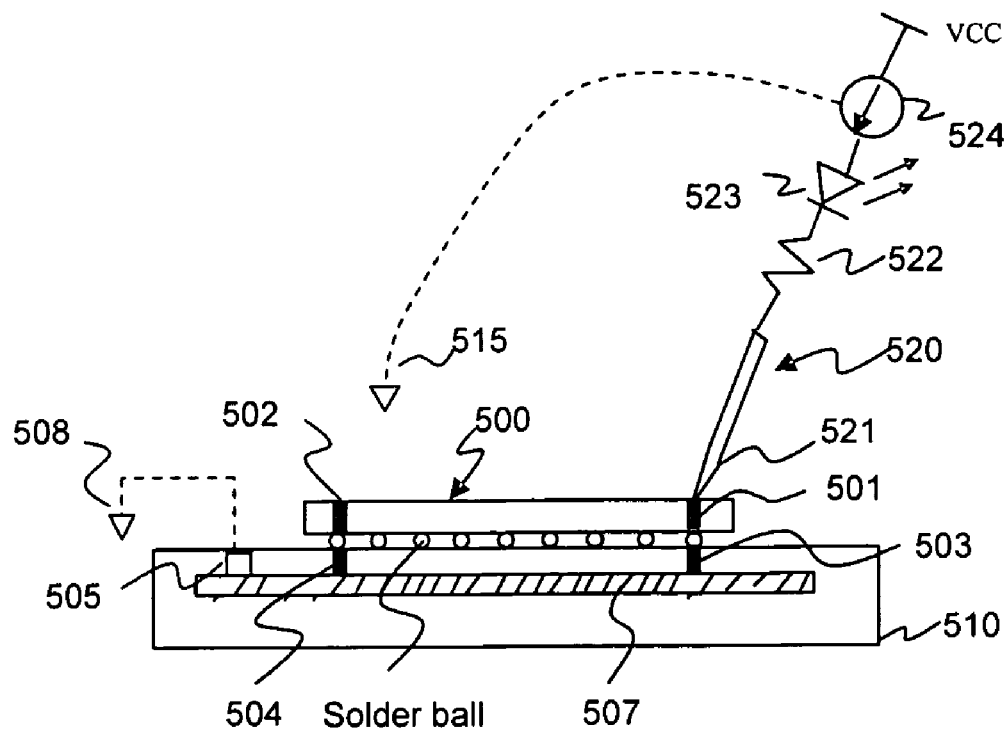
FIG. 5 shows an example of using a single-detection-point probe to check for the placement accuracy and the component contact condition.

FIG. 5 shows an example of using a single-test-point resistance probe 520, to monitor the alignment status of component 500 on target platform 510. Assume a component 500 containing two alignment marks 501 and 502 has aligned to a land pattern on target platform 510, where there is a set of corresponding reference marks 503 and 504. A conduction path is formed from the supply tip 521 of probe 520, through alignment mark 501, to reference mark 503 on target platform 510. A second conduction path is from alignment mark 502 to the reference mark 504 on target platform 510.

To avoid the two reference marks 503, 504 from floating at test, both should be connected to an internal plane 507 on target platform 510, which is connected to a known reference voltage or ground 508 through a surface contact 505. A different approach is to connect the two reference marks together internally. A probe can be applied to test the connectivity after a component is placed. For example, if the supply tip 521 of probe 520 is applied to the top surface of alignment mark 501 and its ground tip 515 is applied to the top surface of alignment mark 502, then a closed current loop is formed to detect a conduction current from the probe's test tip 521, through alignment 501, reference mark 503, internal trace or plane 507, back to reference mark 504, alignment mark 502, and finally to the probe ground tip 515, if the component 500 is well aligned on target platform 510. Although two alignment marks are shown, one alignment mark is adequate if the orientation error is less likely in the component placement.

Alternatively, if the reference pads 503, 504 are connected to an internal plane 507 and a reference voltage or ground 508 is applied to the surface contact 505, then the reference pads 503, 504 will be at the reference voltage or ground. As the test tip 521 is applied to the top surface of any alignment mark on component 500 in this case, a closed loop is formed from the probe, through alignment mark, corresponding reference mark, to system ground and then probe ground, provided that the two grounds are connected together.

As shown in FIG. 5, a test probe 520 may contain a resistor 522, a light-emitting diode 523, a sound buzzer, or a current meter 524 to indicate the status of placement. The resistor limits the maximum current to flow through the probe and the alignment mark. The light-emitting diode provides a visible signal to indicate if it is an accurate placement. The sound buzzer enables users to hear. The current meter shows the amount of current through the probe. The probe can be built in the placement equipment for monitoring the placement status. It can also be a probe for checking the component placement accuracy and contact condition by users manually.

Figure 6:
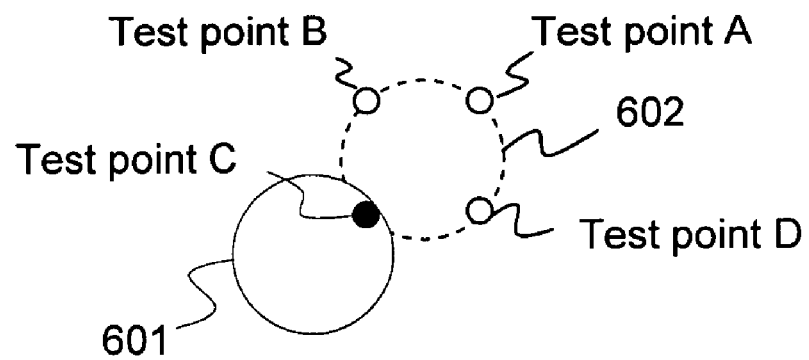
FIG. 6 shows an example of using a 4-point probe for detecting the position deviation in component placement.

FIG. 6 illustrates the use of a 4-point probe to improve the accuracy of component placement. A multiple-detection point probe is essential to fix the component deviation in placement. A 4-point resistance-probe with test points A, B, C, and D is used in this example. A circular reference mark 602 is shown in large dot circle. An alignment mark 601 also in circular shape is shown in large solid circle. To make the illustration simpler, assume that the size of electrical alignment mark 601 is the same as the size of reference mark 602, and also assume that the probe used in this placement has all four test points match the circumference of reference mark 602. If a square reference mark is chosen as an example, then all four test points on probe shall be able to match the four corners of square reference mark after the probe position is aligned with the reference mark.

To fix the deviation in component placement, first it needs to align the probe position with respect to that of reference mark by moving all four test-points A,B,C,D on probe onto or adjacent to the boundary of target reference mark 602. Then, a component is moved in and placed at the coordinate of target land pattern per the information stored in placement database. If there were a deviation in component placement, the alignment mark 601 on component would only partially overlap with the target reference mark 602 on target platform. The 4-point resistance probe can detect this partial overlapping. For example, assume the deviation is toward the lower, left corner and only the test point C at the lower, left corner is in contact with the alignment mark 601. Then, only the test point C detects a current flow through the alignment mark 601 to ground reference mark 602. There is no current being detected by the test points A, B, and D. This is because they are in a region outside the alignment mark 601, which is not electrically conductive. Using this test result as a feedback, the placement equipment can thus know the deviation of component placement. The shifting of component position upward and right-ward can fix the placement deviation, i.e., from the direction current being detected through alignment mark 601 by test points to the direction no current being detected. This process continues until the alignment mark 601 on component is moved to a new position in contact with all test points. Then, the component is accurately positioned.

If after the placement the alignment mark 601 is at a location that two test points detect conduction current, say the two left test points. Then the alignment mark, so is the component, should be shifted rightward until it reaches a position that all four test-points can detect the current flow. In this case, the test probe, the reference mark and the alignment mark are all aligned and the component is accurately placed. The test probe and the component's pickup header in placement equipment can both be adjusted independently.

Adjusting test probe in line with target reference mark at the beginning of each component placement is essential to ensure the placement accuracy. In this special case it can be done, without a component between probe and reference mark, by making the probe in contact with the reference mark, the deviation from the center of probe to the center of target reference mark can be determined by monitoring which test points conduct current. By shifting the probe position toward the direction that no current being detected by test points, the probe can be aligned with the target reference mark. This is a probe alignment step.

A multiple test point probe has more capability than a single test point probe in monitoring the component placement. While a single-test-point resistance probe can be used to detect the placement accuracy and the contact condition, a multiple-test-point probe can be used to detect and provide feedback on the deviation of a displaced component.

Figure 7:
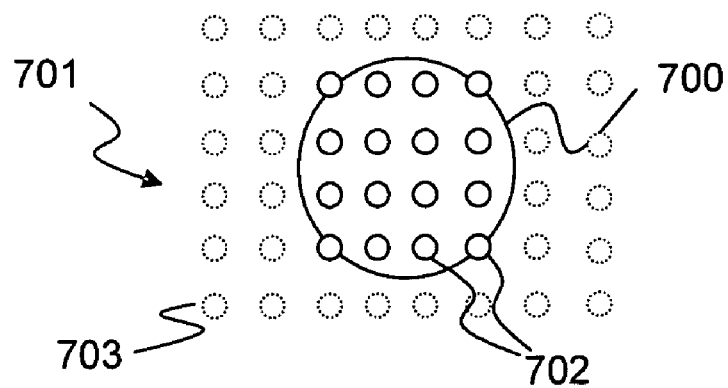
FIG. 7 shows a generalized test probe consisting of an array of test points for detecting the deviation in component placement. The active test points on the probe can be determined on-the-fly.

FIG. 7 shows a generalized test probe consisting of an array of test-points 701. If the area detectable by the array of test points 701 is larger than the size of reference mark 700, then only a subset of test points in the array will be activated to detect the position deviation. The subset of test points to be activated in each component placement can be determined automatically on-the-fly in a similar manner. This can be done by lowering the test probe—assume it is a resistance probe—in contact with reference mark 700 and applying a voltage to all test points in array 701 to see which test point conducts current.

If all test points conducting current were the inner test points in the array, then the inner test points detecting current 702 could be chosen to facilitate the component position adjustment. Those test points in the array not conducting current flow 703 could be ignored in the current position placement. The subset of inner test points in array being activated to facilitate the component position adjustment is the active test points 702. Those test points being ignored in the position adjustment are the inactive test points 703.

Since the center of a multiple-test-point probe is known from the probe structure, the probe design can be simpler if the set of active test points could be repositioned to center around the center of multiple-test-point probe. This can be done by moving the probe to a new position until all inner active test points are in the central region of a multiple-test-point probe. In this new position the center of test probe is aligned with the center of target reference mark and with the outer range of active test points matching the boundary of the reference mark.

If part of test points conducting current were at the edge of multiple-test-point array, then either the size of probe is too small or the probe position is not lined up with the reference mark. Assume the size of probe is too small, i.e., smaller than the size of target reference mark, it could cause an uncertainty in the component position adjustment due to unable to align a small probe to the center of reference mark. Preferably, the range of test probe is compatible with or is larger than the size of reference mark. And if the probe position is not lined up with the reference mark, then it should be adjusted until the center of active test points in array is lined up with the center of the reference mark.

A set of asynchronous set-reset (SR) latches can be implemented in the electronics of test probe, one SR latch for each test point on probe. Corresponding to the subset of test points on probe being activated to monitor the component placement, a subset of SR latches is set to indicate the positions of active test points for each component placement. The entire set of SR latches is cleared at the start of each component placement. A latch with write-enable can also be used to implement the function of SR latch.

Figure 8:
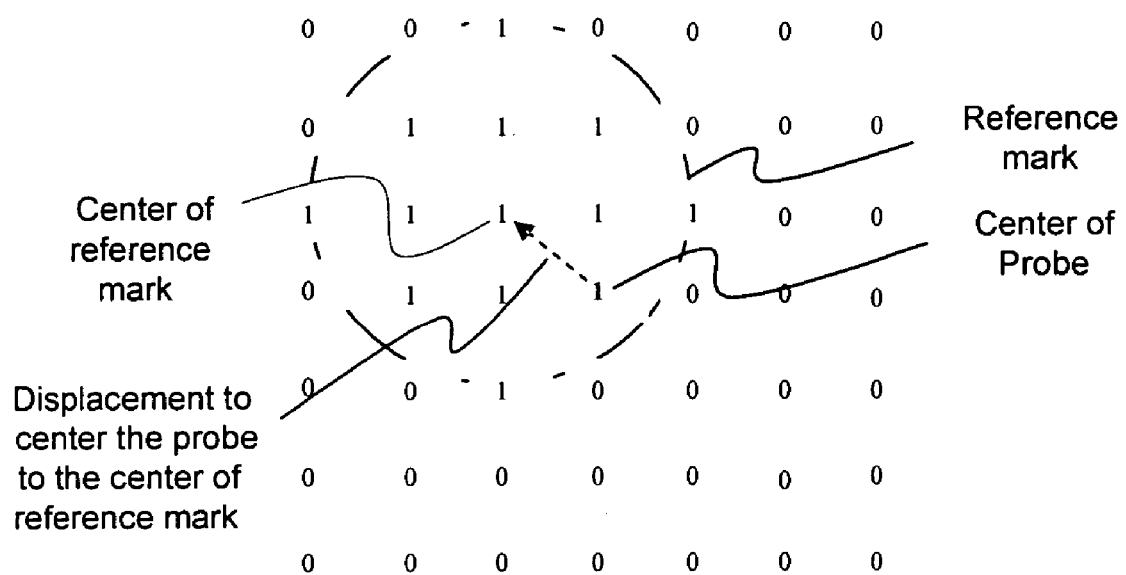
FIG. 8 shows an example on the use of a set of SR latches to track the positions of active test points and to align the center of test probe to the center of target reference mark. The set of SR latches and can be replaced by a set of latches with write enable.

FIG. 8 illustrates a method of using the set of SR latches for aligning a test probe to the center of target reference mark. To align a multiple-test-point resistance probe to a reference mark, after making a contact with reference mark, the SR latch is set if the corresponding test-point conducts current and the SR latch remains reset if the corresponding test-point detects no current. Counters can be used to scan all rows and columns on the set of SR latches to find out which row and which column detect the highest number of ones. The interception of the highest row and column is the center of reference mark. A row counter, a column counter, a comparator, registers for tracking the row number and the column number that have the highest number of ones, and a set of multiplexers to select proper inputs to these logic, etc, can be used to achieve such function. This is merely an example, which should not unduly limit the scope of the invention. By comparing the row number and the column number that have the highest number of ones with the row number and the column number at the center of probe, the displacement to align the probe to the center of reference mark can be determined. The probe can thus be shifted accordingly to align with the center of reference mark. After the re-positioning of probe, the SR latches are cleared to record the new conduction status for all test points on probe. The SR latches being set at this stage contain the information of the set of active test points aligned with the center of reference mark.

For aligning component, another set of transparent latches can be added to the probe electronics to track the instantaneous conduction status of all test points each time the component changes to a new position. The contents of transparent latches record the overlap status between the alignment mark and the reference mark. Their contents will be compared with the contents of SR latches. If the contents of both sets match, then the component is accurately aligned on the target land pattern.

Figure 9:
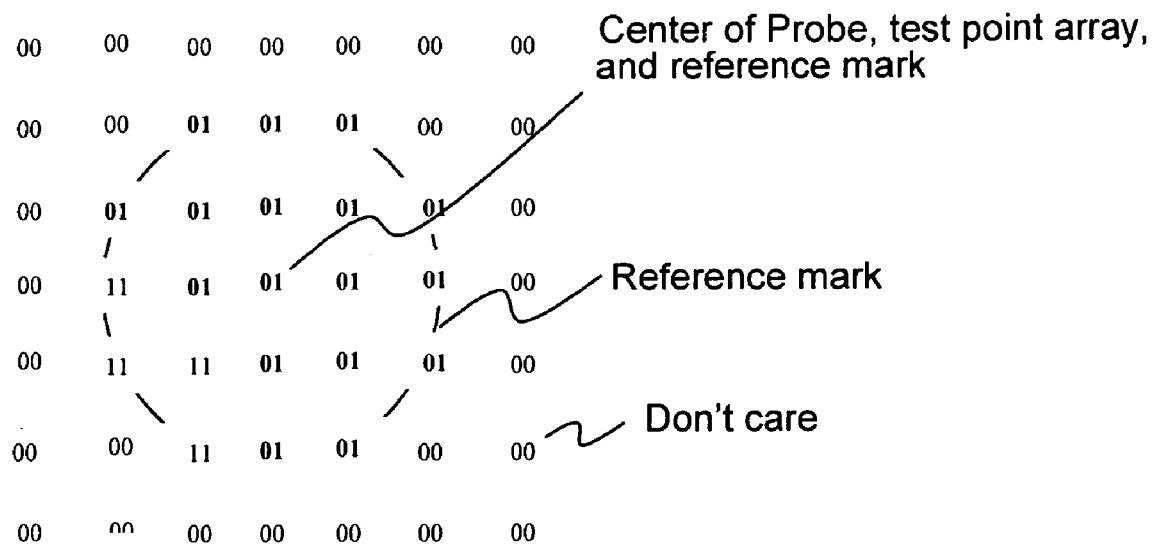
FIG. 9 illustrates the use of two sets of latches to determine the direction and displacement of a deviated component. One set of latches with status being shown in the first digit of a binary pair indicates the overlap status between alignment mark and reference mark. The other set of latches with status being shown in the second digit of a binary pair indicates the position of active test points.

FIG. 9 shows an example of using two sets of latches to derive the direction and displacement of a deviated component. The first digit in the binary pair is the status of the set of transparent latches, which indicates the overlap status between the alignment mark and the reference mark. The second digit in the binary pair is the status of the set of SR latches, which indicates the position of active test points.

By comparing the contents of these two latches, or the value of the binary pair, the direction and the adjustment displacement for a misplaced component can be derived. To make the explanation simpler, let's assume the size of alignment mark is the same as the size of reference mark. A "1" in the first digit indicates the area that the alignment mark overlaps with the reference mark. A "1" in the second digit indicates the location of active test points. By referring to the "11" region in FIG. 9, which is known by a simple AND logic, there are three columns to the right side containing all "01"s and only two rows to the up side containing all "01"s inside the reference mark range. The placement equipment thus knows that a shifting of three positions to the right side and two positions to the up side can re-position the component correctly. The position of test points containing "01" can be known by a simple exclusive OR gate. This illustration is merely an example, which should not unduly limit the scope of the invention.

While a larger reference mark can extend the range of adjustment for a deviated component, a smaller alignment mark can still work properly if test probe is large enough, i.e., if the range of all test points on probe is larger than the size of reference mark. To support a smaller alignment mark, a third set of latches can be incorporated in the probe electronics to indicate the effective sub-range of active test points where the small alignment mark will be referred to in alignment. The third set of latches servers as an enable mask in determining the effective range of "01"s in the derivation of the component shift displacement.

Figure 10:
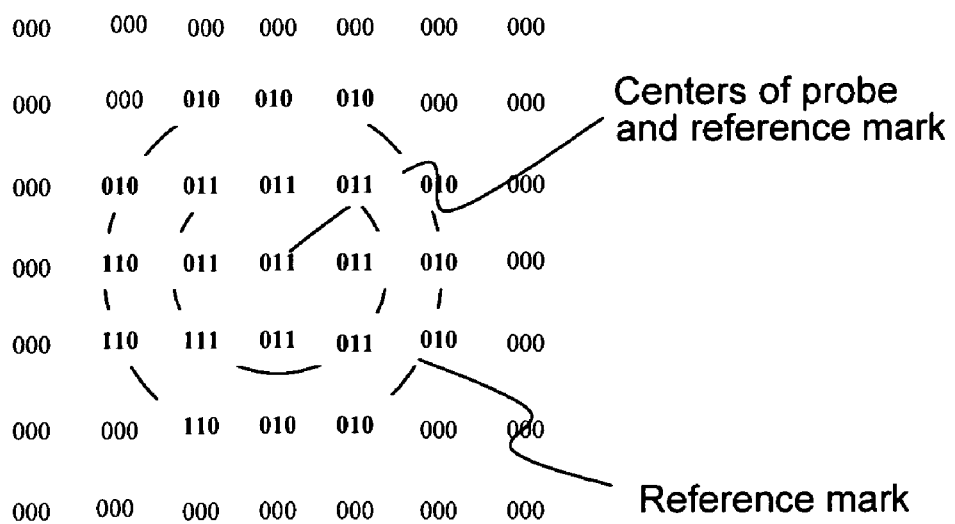

In FIG. 10, the third digit in the binary tuple indicates the sub-range inside reference mark that matches the size of alignment mark. A "1" in the third digit, such as the binary tuples "111" and "011", indicates the location of the sub-set of active test points for use as the target for a smaller alignment mark to align to. While the entire range of active test points, determined by the size of reference mark, is used to detect the presence of alignment mark, it is the sub-range of active test points being used as the target for the small alignment mark to align to. A "11" in the first two digits of tuple, i.e., "11×", as shown in the example of FIG. 10, represents the overlapping area between the alignment mark and the reference mark. The tuple "011" indicates the area that the alignment mark is still not in line with the reference mark. There are two columns to the right side of "111" containing "011"s and two rows to the top side of "111" containing "011"s in the target sub-range in FIG. 10. Thus, a shifting of component two positions upward and two positions rightward can still fully align the alignment mark to the reference mark, even if the alignment mark is smaller than the reference mark.

The actual sub-range of active test points associated with the smaller alignment mark can be derived by referring to the diameter information of alignment mark stored in the placement database or by using an image sensor associated with the placement equipment to measure the diameter of the alignment mark on-the-fly.

Figure 11:
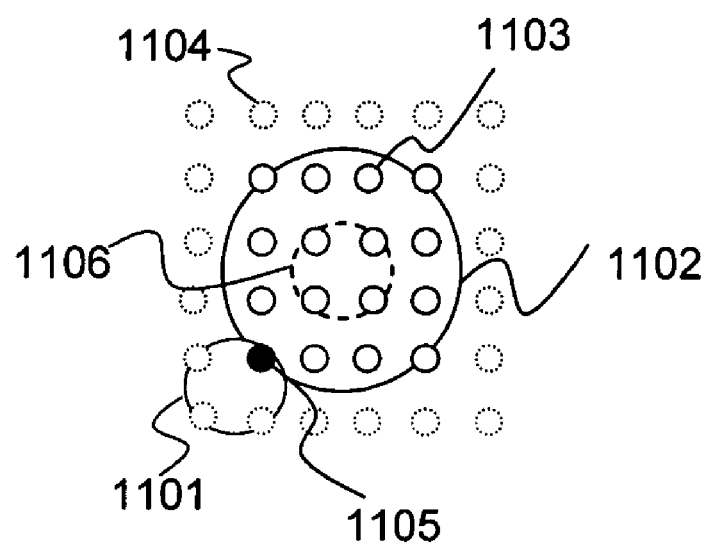
FIG. 11 shows a graphical interpretation on the use of a generalized probe to fix a deviated component, where the size of alignment mark on component is smaller than that of reference mark.

FIG. 11 shows a graphical interpretation on the use of a generalized test probe to fix the position of a deviated component. The alignment mark 1101, which reflects the position of component, is smaller than the reference mark 1102 in this example. Before each component placement starts, the range of active test points on probe should be determined in advance, i.e., by moving the probe on top of the reference mark 1102 but without component in between and applying a voltage to all test points to see which one conducts current. Since the center of test probe is known, the set of active test points can be chosen to have the probe in line with the center of reference mark 1102 and to have the outmost active test points adjacent the boundary of reference mark 1102. In FIG. 11, the inactive test points on probe are shown as dot circles and the active test points are shown as solid circles and solid black dot. The sub-range of active test points to be used for aligning a smaller alignment mark to the reference mark can also be derived on-the-fly by using an image sensor inside the placement equipment to measure the diameter of the alignment mark or by referring to the diameter information of alignment mark stored in the placement database.

After initial component placement, the alignment mark 1101 on component is either entirely or partially within the range of active test points being defined by the reference mark 1102. Assume there is a deviation in the initial component placement and assume only one corner active test point 1105, shown in the solid black dot in FIG. 11, detects current flow. The placement equipment could then use the subset of the active test points as target to shift the alignment mark rightward and upward until the alignment mark matches the entire subset of active test points 1106, shown as the big, central dot circle in FIG. 11. Thus, the component can still be accurately aligned to a target land pattern even if the alignment mark is smaller than the reference mark.

On the contrary, if the area of alignment mark were much larger than the area of reference mark, the placement accuracy would be degraded. This is because the range of active test points defined by a small reference mark is rather limited. It is unable to proceed the component adjustment process because no adequate feedback is available to instruct the large alignment mark on the component to move its center to line up with a limited set of active test points. For resistance probing, the effect of using a larger alignment mark is similar to the effect of using a single-test-point probe, where the area covered by a single test point probe is very narrow, similar to the effect of a smaller test probe or a smaller reference mark. Nevertheless, a smaller reference mark can detect much higher placement accuracy under a single-test-point probe, unless the size of reference mark is too small to be detectable.

In case after initial placement the component is placed beyond the reference mark. No conduction current is detected by any of the active test points in this case. This indicates either the placement equipment is improperly set up or the worst-case deviation in the component placement is underestimated to cause the alignment mark step beyond the undersized reference mark. An improper system setup or operational error can thus be detected easily.

Figure 12:
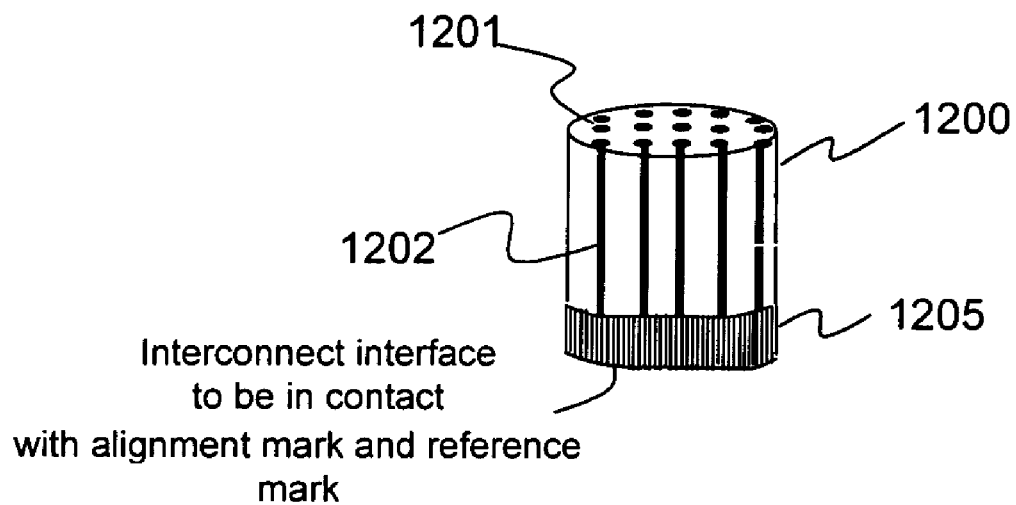
FIG. 12 is a simplified diagram showing a test probe laminated with ACE material as interconnect interface to improve the contact condition between the test points and the alignment mark or between the test points and the reference mark.

To improve the durability of test probe and to ensure good contact to alignment mark and reference mark, an anisotropic conductive elastomer (ACE) 1205 can be laminated on the surface of a generalized resistance probe 1200 as the interconnect interface, shown in FIG. 12. In this figure, each test point consists of a conduction pipe 1202 inside the probe 1200. This figure is merely an example, which should not unduly limit the scope of the invention. For example, the probe is shown in circular shape, but other probe shape, such as square, rectangular, triangle, trapezoid, other irregular shape, or even a flexible cable, is likely. Also, although the test points are shown in a regular array in the figure, the test points in array can be arranged in any configuration based on the requirements of applications.

To resolve the orientation error in component placement, two alignment marks can be incorporated at the opposite sides of component. It is more likely to encounter an orientation error for the components with a large contact array or ultrafine contact pitch.

Figure 13:
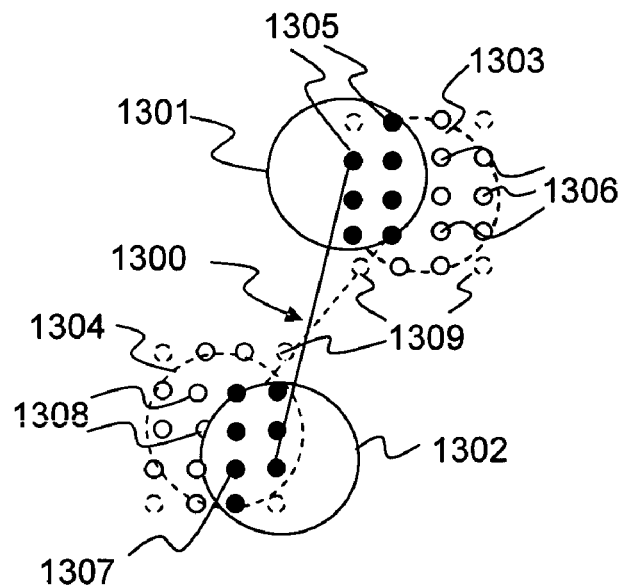
FIG. 13 shows that incorporating two alignment marks on a component can fix the orientation error in component placement.

FIG. 13 shows an example of incorporating two alignment marks on component to fix the orientation error in component placement. Assume that the component is tilted counterclockwise after initial placement and assume that the size of alignment mark is the same as the size of reference mark. Two large solid circles in the diagram represent two alignment marks 1301, 1302 on component. An artificial solid line linking these two-alignment marks 1301, 1302 is drawn to show an imaginary orientation of the component after initial placement. Two corresponding reference marks 1303, 1304 on target platform are shown in large dot circles, connecting by an artificial dot line to indicate the ideal target orientation. The acute angle intercepted by the solid line and the dot line is the orientation error after initial placement. Assume that there is no displacement error, then the interception point is the center of the component 1300. If assume two test probes are used to monitor the placement of a component containing two alignment marks, although one is adequate if the active test points and the center of test probe can be recorded by the placement equipment for each probing.

Before placing a component, the probes must be aligned with the target reference marks. For resistance probe, this is done by making the probe in contact with reference mark to determine the range and the coordinate of active test points with respect to the center of reference mark. Then, a component is picked and placed at the target land pattern with the probe moved up. If there is no orientation error in the component placement, both alignment marks 1301, 1302 will stay exactly on top of reference marks 1303, 1304 and match the range of active test points. If there is an orientation error, then some of the active test points on probe will be outside the range of alignment mark and conduct no current. By monitoring the conduction status of active test points, the direction of adjustment can be known, i.e., by rotating component or alignment mark toward the side that active test points detect no current, provided that the component pickup header in assembly is capable of performing angular position adjustment.

In FIG. 13, the two alignment marks 1301, 1302 on component are in the upper right and lower left locations. If a counter-clockwise orientation error occurs after component placement, then the active test points 1305 detecting conduction current will lean at the left-hand side for the upper probing and the active test points 1307 detecting conduction for the lower probing will lean at the right-hand side. By rotating the component from the side that active test points detect current to the side detecting no current, i.e., in the direction of clockwise rotation, the component orientation error can be fixed. But were if all current sensing tests points appear at the same side under both probing, say all at the left-hand side, then a displacement error had taken place and the component should be shifted right-toward to fix its displacement error.

The alignment technique can be adaptive to application needs. For example, if the placement system has intrinsic skew such that the placement error is larger in one direction than the other, then a rectangular reference mark can be chosen with its long side corresponding to the direction of larger deviation. Preferably, the size of probe is larger than the size of reference mark in order to align the probe and to determine the range of active test points on probe automatically. Also preferably, the size of reference mark is larger than or is about the size of alignment mark.

The resistance probing that requires direct contact measurement may cause contamination of solder paste around target land pattern in case it needs to move the displaced component around on target platform. There is no such problem for the components laminated with ACE as interconnect interface. The components laminated with ACE interconnect interface also makes a good contact with the land pattern on target platform.

To avoid the adverse effect of potential solder paste contaminations, it is also possible to laminate a thin layer of solder material on the surface of land patterns on PCB, similar to the solder ball material on package, during PCB fabrication. Then, the solder paste-printing step can be eliminated in surface-mount assembly, thus free from solder paste contaminations.

Figure 14:
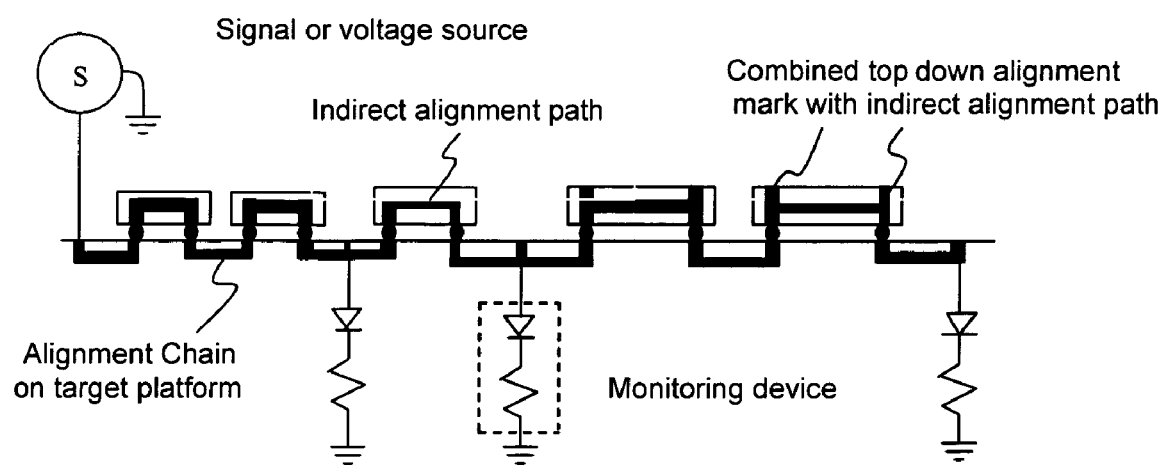
FIG. 14 shows a simplified diagram of serial alignment chain on target platform.

The top-down alignment mark and the indirect electrical alignment paths can be combined and incorporated in the same component. The top-down alignment mark can improve the placement accuracy and the indirect alignment paths can be linked in a serial alignment chain to monitor the contact status of all components in the chain, as shown in FIG. 14. This is particular useful for the electronic systems assembled with components laminated with ACE interconnect.

Alignment Using Capacitance Probe

The electrical alignment can also be achieved by using non-contact method. Rather than using a resistance probe to measure the on/off resistance at the direct contact point, a capacitor probe can be used to align component in non-contact approach.

Figure 15:
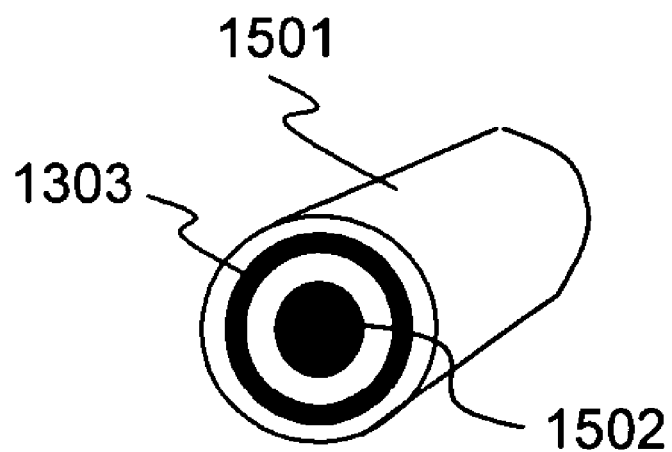
FIG. 15 is a simplified diagram of capacitance sensor, which uses a guard to focus the sensor's electrical field.

FIG. 15 shows an example of capacitance sensor manufactured by Lion Precision of St. Paul, Minn. To improve measurement accuracy, the electrical field from the sensor needs to be confined within the space between the sensor's surface and the reference target. A separate conductor kept at the same voltage as the sensor itself is used as a guard to surround the sides and the back of the sensor. When an AC signal is applied to the sensor, a separate circuit applies exact same excitation voltage to the guard. Because there is no voltage difference between the sensor and the guard, there is no electrical field between them. Any other conductors beside or behind the capacitance probe form an electrical field with the guard, instead of the sensor. Only the unguarded front end of the sensor forms an electrical field to a reference target. The sensor creates an electrical field that is a projection of its size and shape. For instance, a round sensor could project a cylindrical electrical field to a reference target. In Lion Precision's capacitor sensor, the cylindrical electrical field could spread up to 30% at an effective range of 40% of the sensor diameter.

As an AC signal is applied to the sensor surface, AC current will flow through the capacitance formed in the gap between the sensor and the target reference. The amount of current that flows is dependent on the amount of capacitance between the sensor and the target reference, i.e., determined by the size of separation and the extent of overlap between the surfaces. If the senor is fully aligned with the reference target, the capacitance formed in the gap is the largest and the AC current will be the highest. If the sensor is entirely beyond the reference target, there is no surface area overlap and the capacitance is irrelevant, provided that no foreign conductor besides the reference target is within the sensor range.

Figure 16:
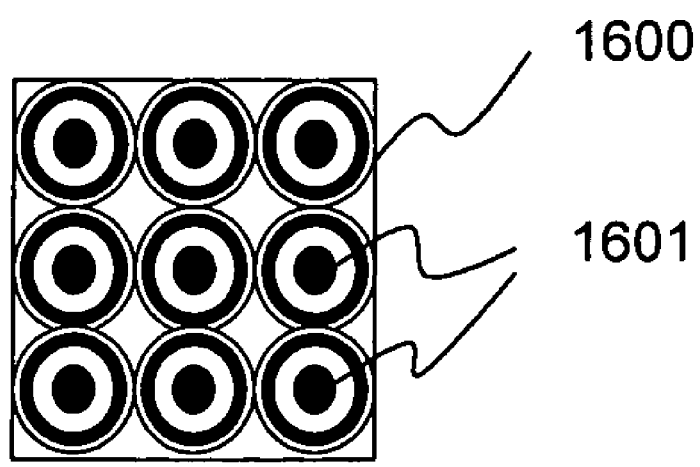
FIG. 16 is a simplified diagram showing a set of capacitance sensors grouped in an array to form a multiple-sensor capacitance probe for use in non-contact electrical aligning.

A set of guarded capacitance sensors can be grouped in an array to form a multiple-sensor capacitance probe, as shown in FIG. 16, for non-contact electrical probing. The sensors in the array can also be selectively activated per applications requirement. For example, FIG. 16 shows a nine-sensor probe. But if only the sensors at the four corners of probe are activated for placement detection, then it becomes a four-sensor capacitance probe.

For probing alignment, the exact capacitance detected by each sensor on probe is not a major concern. This is because in alignment applications the capacitance sensor is not to measure the exact separation between two parallel objects, where a precise capacitance reading is essential. It is the relative capacitances, determined by the extent of area overlapping between the probe surface and the target reference area, plays a key role. The effective range of a multiple-sensor capacitance probe for measuring the placement accuracy is greater than that of a single sensor, provided that no foreign conductor is within the range of sensors' electrical field to disturb the relative capacitance measurement.

As an AC excitation is applied to all active sensors on probe, all sensors would detect same capacitance between sensor and target reference and thus would measure same amount of AC current if the probe were fully aligned with the reference target. If misalignment exists, the portion of active sensors on probe detecting area overlap with the reference target would conduct the highest current while the portion of active sensors beyond the reference target would conduct a minimal current. By comparing the relative magnitude of AC currents among the array of active sensors, the direction of deviation can be known. The deviation can be fixed by aligning the component alignment mark under the capacitance probe or by moving the displaced component toward the direction where the active sensors detect lower level of AC current. It does not need to have the probe in contact with target platform or component in this process.

The capacitance sensor is normally calibrated to a grounded target. The body or outer jacket of capacitance probe should be electrically wired to ground to improve the probe accuracy. The reference target also requires properly grounding. A reference target not properly grounded could degrade probe's sensitivity and accuracy. Fortunately, many targets, while not directly grounded, have a significant capacitance to ground though its environment, such as the component pickup header. The large capacitance eventually shorts the target reference to ground under AC excitation. Thus, connecting the reference mark on target platform to a ground plane or the alignment mark at component surface to its local ground is helpful but not essential as long as the ratio between the target's capacitance to ground and the target's capacitance to sensor is reasonably large. A ratio over 10 will have the error in capacitance measurement less than 10% as seen in the case of two capacitances in series.

Using capacitance probe to align component, only the surface marking at the top of the component is relevant. The surface area of alignment mark on top of component determines the capacitance value detected by a capacitance sensor. It no longer requires a conduction path from top to bottom on component as an electrical alignment mark, as seen in the case of resistance probing. However, the Cartesian coordinate relationship between the alignment marking at the top and the contact array at the bottom of component should match the coordinate relationship between the reference mark and the target land pattern on target platform. To align an alignment marking under an capacitance probe can be done by moving the alignment marking around under capacitance probe, assumed the probe has already aligned with a reference mark, and monitoring where all active sensors over the alignment marking detect same amount of currents, which exceeds certain minimum threshold. After the alignment marking is in line with probe, the aligned component could then be lowed down to place on target land pattern accurately.

Using a non-contact probing, such as capacitance probing, aligning the probe to target reference and aligning the alignment marking to probe can be done independently. Thus, the size relationship between the alignment marking on component and the reference mark on target platform is no longer as critical as the case of contact probing, provide that the probe detection range is larger enough to cover both of them. Thus, a component with a large alignment mark can be still aligned accurately on a smaller reference mark under a non-contact probing.

The electrical aligning technique can also be used to monitor the accuracy in the stacking of packaged chips, where a conduction path can be inserted from the top to bottom on the packaged chip as an electrical alignment mark. The electrical alignment technique can also be used to monitor the accuracy in the bare-die stacking, where a conduction path from top to bottom in bare-die can be created using ion implantation, diffusion, or other method.

Figure 17:
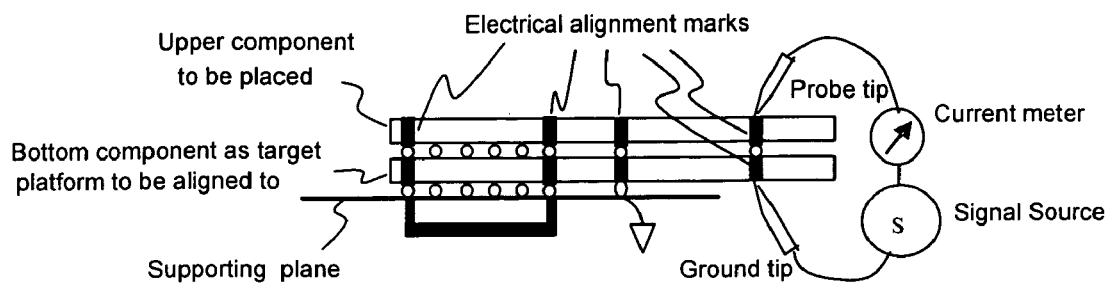
FIG. 17 in an example on the use of electrical alignment technique to monitor the component stacking.

FIG. 17 shows an example of using electrical alignment technique to monitor the stacking of components. Several variations are shown in the example to illustrate the applications under different situations. The accuracy of component stacking can be known by directly placing a probe at the top of the top component alignment mark and at the bottom of the bottom component alignment mark. If the stacked components are to be placed on a supporting plane, the alignment mark at the bottom of the bottom component can be connected to a ground reference point on the supporting plane to create a monitoring path from probe to ground. Or a pair of electrical alignment marks can be incorporated on the components to be stacked, which can be connected to a conduction path in the supporting plane for probe to monitor the stacking accuracy from the top of both alignment marks on stacked components. The little circle in the figure indicates contact pints to other stacked component or supporting plane.

Figure 18:
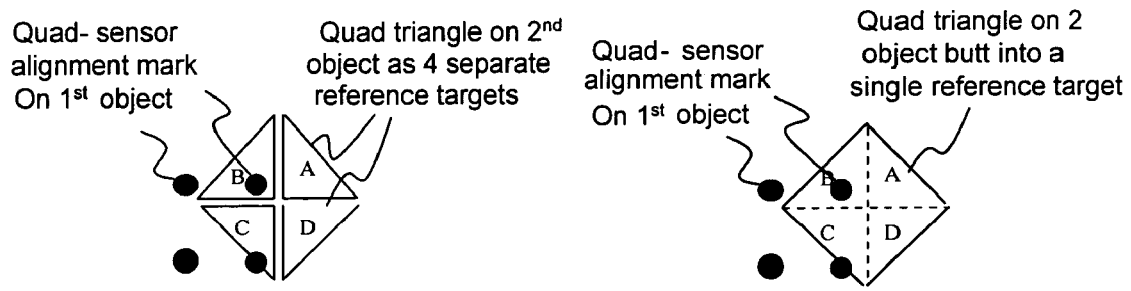
FIG. 18 shows a different application of electrical alignment technique for aligning an object with quad-sensor alignment mark onto the second object with a quad-triangle reference mark.

FIG. 18 shows a different application of using the electrical alignment method to align two objects together. In this example an array of 4 sensors is incorporated in the first object and an array of 4 triangles as reference target is incorporated in the second object for monitoring the alignment accuracy. The four reference triangles can be separated as four reference marks or can be butt together to form a single one as shown. The four sensors can be a set of resistance probe in contact measurement or can be a set of capacitance probe in non-contact approach.

The setup works in a similar manner. Assume the first object is deviated from the second object in the lower, left direction to cause the two left alignment sensors on the first object outside the quad-triangle reference mark associated with the second object. If assume the range of sensor array and the range of reference array are matched, then an instruction to shift the first object toward the right-hand side direction could be generated by the sensing electronics. But after the first object is shifted toward the right-hand side, the two lower right sensors would then step beyond the reference mark region (triangles C, D) on the second object, but with the two upper sensors still within the range of reference triangles at this moment. By moving the first object upward, i.e., toward the direction that the sensors have detected currents, the four alignment sensors can then be moved into the range of reference mark and the two objects are finally aligned.

Alignment Using Optical Probe

Figure 19:
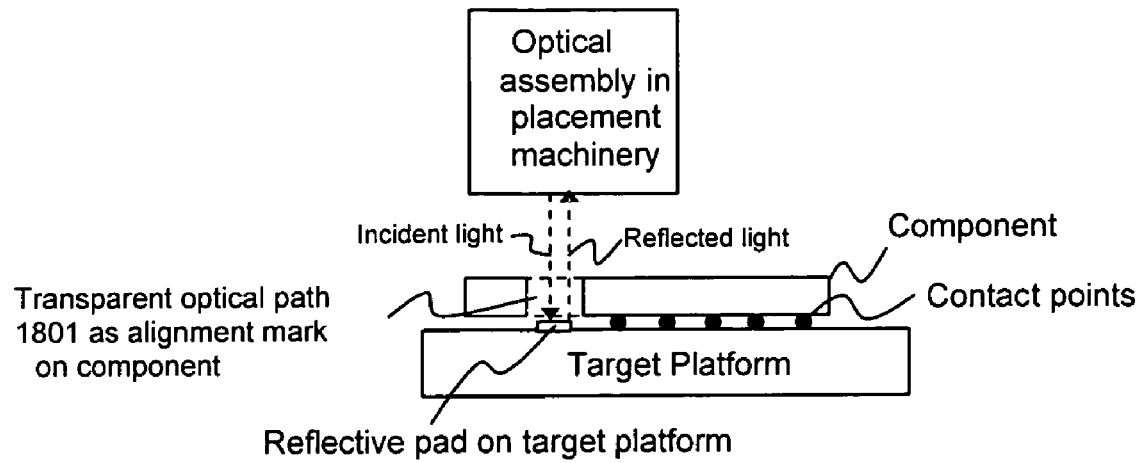
FIG. 19 shows a transparent optical path on component can be used as an optical alignment mark. If coupled with a matching a reflective pad on target platform, it can be used to improve the component placement accuracy.

If the alignment marking on top of component and the reference marking on target platform are highly reflective, an optical probe can be used for the component alignment. The alignment mark can also be a transparent optical path 1901 on component that enables a laser beam to pass through and reflect back from a reference mark underneath, as shown in FIG. 19. Either a reflective surface marking on top of component or an optical path on component can be used as an optical alignment mark.

In optical probing, it does not need to ground the alignment mark or the optical path on component, nor is there a need to ground the reference mark on target platform. However, the spatial relationship between the alignment mark at top and the contact array at the bottom of component should match the spatial relationship between the reference mark and the associated land pattern on target platform, same as other probing techniques.

Figure 20:
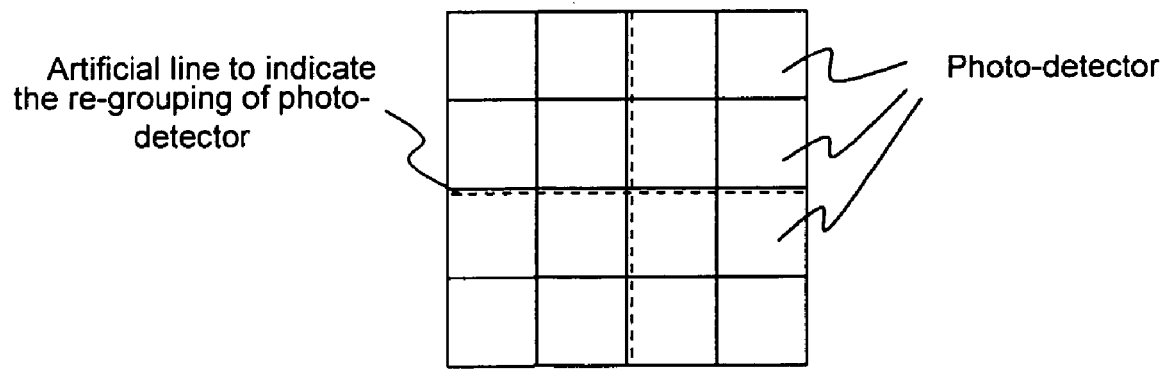
FIG. 20 is a simplified diagram showing an array of photo-detectors grouped in an array to form a multiple-detector optical probe for use in component alignment.

FIG. 20 shows a set of photo-detectors or photo-diodes grouped in an array to form a multiple-sensor optical probe for non-contact probing. The sensors in the array can be selectively grouped per the resolution requirements. For example, FIG. 20 shows a sixteen-sensor probe. But if the boundary of the reflection beam is out of focus and is slightly blurred or if the size of reflection beam is rather large, the sixteen photo-detectors on the optical probe could be rearranged into four groups to form a four-senor optical probe. The re-arrangement of sensors can be done by re-arranging the input signals to the probe electronics. In a different example, if the incident beam can be adjusted and focused, only the four sensors at the center of the probe could be chosen as the target sensors of alignment to increase the alignment accuracy, although the entire range of all 16 sensors are used as active sensors to increase the incident beam search range.

If the generalized test probe, consisting of an array of test sensors, is a resistance probe, it measures the connection resistance or DC current at each contact point. If it is a capacitance probe, it measures the AC current at each test sensor, which reflects the area overlapping between the surface of each sensor and the target reference. If it is an optical probe, it detects the photocurrent at each photo-detector, which indicates the position of the reflection beam.

Using optical alignment, the probe position must be aligned with the center of reference mark on target platform at the beginning of component placement. The reference mark can be a simple reflective pad in optical alignment. Ideally, the diameter of incident light beam shall be compatible with the size of reference mark. Otherwise, an uncertainty takes place, regardless the size of incident laser beam is too large or the size of reference mark is too large. On the detector side, the incident beam shall be properly focused to ensure it is within the range of optical detectors. After aligning the probe to the center of reference mark, a component is moved in and placed at the land pattern. Next is to align the position of alignment mark with respect to the position of the probe. For non-contact probing, it is the two-step indirect alignment method that determines the ultimate accuracy in component placement. Depending upon how the light beam is collimated in the optical approach, the relative sizes of alignment mark and reference mark are not as critical as the case of resistance probing.

Figure 21:
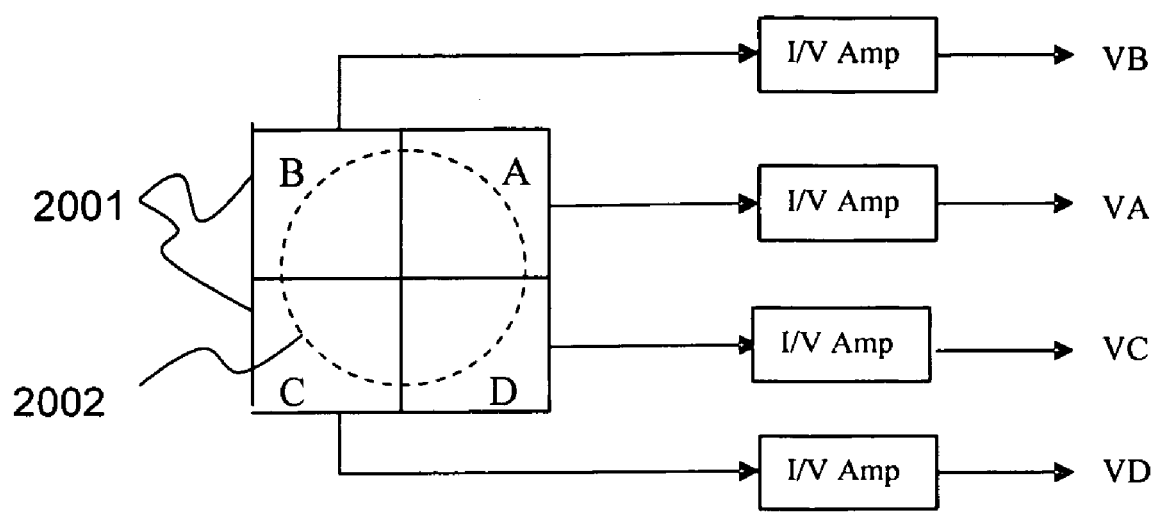
FIG. 21 is a simplified diagram of optical setup with four photo-detectors and four I/V amplifiers for the use in adjusting the deviation of displaced components.

FIG. 21 shows an example of optical pickup containing a four-photo-detector probe and associated I/V amplifiers for detecting the deviation of displaced components. Each I/V amplifier includes a current-voltage converter and a voltage amplifier. As light incidents on the photo-detector on probe, a current is generated, which is then amplified by the I/V amplifier. A circular light beam 2002, reflected from a target reference is also shown. The reflected beam will be at the center of optical pickup if the component is fully aligned to the reference target.

Four different voltages, VA, VB, VC, and VD, are generated by the optical pickup in FIG. 21. A set of comparators can be used to compare the voltage output from these I/V amplifiers. The direction of adjustment can be determined by comparing the output voltage of each I/V amplifier with a predetermined threshold voltage. A high output voltage detected by the comparator indicates the probe and the target reference has area overlap. A low output voltage detected by the comparator indicates the corresponding area is still misaligned. By shifting the component from the position that comparator detects high output voltage to the position that comparator detects low output voltage, the misalignment can be fixed. If none of the comparators detect a voltage level that exceeds the pre-determined threshold level (VT), i.e., no relevant reflection beam is detected by any of four photo-detectors, it indicates the component is entirely misplaced or the optical probe is not in line with the target reference at all. The component is accurately aligned on the target platform if all four voltage levels reach the pre-determined threshold level.

Alignment Procedure

The procedure of using alignment technique to improve the accuracy in component placement is summarized as follows.

a. In preparation for component placement in assembly, some relevant information, such as the coordinate of the center of land pattern or the coordinate of reference mark associated with the land pattern on target platform, the probe configuration, the size of alignment mark on component to be placed, and so on, are entered into the database of placement system. The information is useful in the placement automation.

b. Load a target platform to assembly equipment. A reference point on target platform is chosen as the origin to match the origin of the coordinate system stored in placement database.

c. The probe can be a single-sensor probe for monitoring the placement accuracy, or it can be a multiple-sensor probe for fixing the deviation of a displaced component. To fix the deviation of component not accurately placed, it needs to align the probe to the center of target reference mark prior to placing component on target platform. The probe can be a resistance probe, which measures the on/off conduction from probe sensor, through alignment mark, to reference mark via a direct contact approach. The probe can be a capacitance probe, which detects the extent of area overlap between the probe and the target reference via a non-contact approach. The probe can also be an optical probe, which measures optical alignment between the probe and a target reference.

Aligning probe to the center of a reference mark can be done by moving the probe to the coordinate of reference mark per placement database and adjusting the probe position, if necessary, until all sensors detecting current flow are the inner sensors around the center of the probe. For a resistance probe, the probe must be lowered down to make a direct contact with the reference mark. For a no-direct-contact capacitance probe, the probe needs to move to the range that no foreign conduction object is within the range of its electrical field. For an optical probe, the probe needs to adjust height to have the light beam matches the diameter of the target reference.

The inner sensors detecting current flow, based on the measurement through reference mark, determine the range of active sensors on probe. With proper adjustment the center of these active sensors can match the center of reference mark automatically. The center and the range of active sensors on probe are the new position and target for the alignment mark on component to be aligned to. The multiple-senor probe is able to provide feedback for component position adjustment, which is different from a single-sensor probe that only can detect the placement accuracy.

d. Pick up a component and place it at a target land pattern. The placement is based on the coordinate of the center of target land pattern or the coordinate of reference mark.

e. Adjust the component pickup header until the position of component alignment mark is in line with the probe. The direction of adjustment is in the direction to make more active sensors detect current flows. The alignment is achieved when the alignment mark is in the position that all effective active sensors on probe can detect its presence.

Since the spatial relationship between the reference mark and the land pattern on target platform can be pre-fabricated to match the spatial relationship between the component's alignment mark and its contact array, the component can then be well aligned to the target land pattern. Some minor out-of-specification components could be also used in assembly under such alignment technology.

f. For components with embedded indirect alignment path, all indirect alignment paths can be connected in a daisy chain to form a serial alignment chain or several shorter alignment chains. The alignment chain can be used to detect the connection status for all components in the chain when the system is put in use The above sequence of steps illustrates a method according to an embodiment of the present invention. Other alternatives can also be provided where steps are added, one or more steps are removed, or one or more steps are provided in a different sequence without departing from the scope of the claims herein.

The alignment technique is not limited to the placement of components on PCBs in assembly. It can also be used in a variety of applications, such as the monitoring of the chip packaging, where the die to be mounted onto a substrate is viewed as the component and the substrate of the package is viewed as the target platform. Eventually, the alignment mark and probing technique can be applied to multiple package stacking, the bare die stacking, the multi-chip carrier module assembly, the module assembly, the encapsulated card assembly, and the motherboard assembly, and so on. One of ordinary skills in the art would recognize many variations, modifications, and alternatives.

What is claimed is:

1. A system for assembling one or more components for one or more target platforms, the system comprising a set of alignment marks in a component including a contact region to detect an accuracy of a placement of a component for one or more target platforms the system comprising:
    a first conductive pathway configured to conduct electrical current from one region to another region of the component, the conductive pathway facilitating detection of a position accuracy of the component placement for the target platform;
    a first contact region configured on the one region of the component and a second contact region configured from the other region of the component, the first contact region and the second contact being at least two of the plurality of alignment marks;
    a target platform comprising a surface region, the target platform comprising a second conduction path and a third conduction path, the second conduction path comprising a first access point and a second access point, the third conduction path comprising a third access point and a fourth access point;
    a plurality of contact regions provided on one or more portions of the bottom surface region of the component and respectively coupled to a plurality of land patterns provided on one or more portions of the target platform;
    whereupon the first conduction path, the second conduction path, and the third conduction path are configured in a serial manner to detect an alignment state between the plurality of contact regions to the plurality of land patterns.

2. The system of claim 1 wherein the one region is a first edge region and the other region is a second edge region.

3. The system of claim 1 wherein the component is selected from at least one or any combination of an integrated circuit device, a bare die, a packaged chip, a stacked device, or an integrated circuit device laminated with an anisotropic conductive membrane.

4. The system of claim 1 wherein the target platform is selected from at least one or any combination of a substrate, a bare die, a printed circuit board (PCB), a base of a stacked chip, a base of a stacked package, or a multiple-chip carrier.

5. The system of claim 1 further comprising a set of geometric marking selected from at least one or any combination of a circular shape, a square, a rectangle, a triangle, a trapezoid, or a set of dots.

6. The system of claim 1 further comprising a set of reference marks to be provided for the set of alignment marks for the target platform to align the component to the target platform; the set of reference marks comprising at least one of a plurality of reference marks selected from:
    a reference pad on a surface of the target platform configured to conduct an electrical current to an internal trace of the target platform;
    a reference pad on a surface of the target platform configured to conduct an electrical current to an internal plane of the target platform;
    a geometric marking on a surface of the target platform for use in a non-contact alignment; or
    a contact point in a component land pattern on the target platform;
    whereupon the spatial relationship of the set of alignment marks to the contact region of the component matches a spatial relationship of the set of reference marks to a target land pattern of the target platform.

7. The system of claim 1 further comprising a single reference mark to facilitate detection of spatial accuracy in the component placement for the target platform.

8. The system of claim 1 further comprising multiple reference marks to facilitate detection of a spatial displacement and an orientation error of the component in the component placement for the target platform.

9. The system of claim 1 further comprising a set of geometric marking selected from at least one or any combination of a circular shape, a square, a triangle, a rectangle, a trapezoid, or a set of dots.

10. The system of claim 1 wherein conductive pathways associated with a set of components connects in serial arrangement with conductive pathways at a target platform to form one or more continuous conductive chains at the target platform to monitor placement and electrical contact of the set of components at the target platform.

11. The system of claim 1 wherein conductive pathways associated with one of a plurality of components being selected from a set of non-soldered components, the set of non-soldered components including one or more components laminated with anisotropic conductive membrane layer at the interconnect interface, the set of conductive pathways at the components being incorporated in a serial arrangement on a target platform of an assembly to monitor the placement and electrical contact of the set of components on the target platform in the assembly.

12. The system of claim 10 wherein the one or more continuous conductive chains further comprises at least one of a plurality of detection devices selected from a light-emitting diode (LED), a photo-detector, a current meter, a current sensing device, a thermal sensing device, or an audible device to monitor conduction status of the one or more continuous conductive chains.

13. An assembled multi-component apparatus comprising:
    a target platform comprising a surface region, the target platform comprising a first conduction path and a second conduction path, the first conduction path comprising a first access point and a second access point, the second conduction path comprising a third access point and a fourth access point;
    a component comprising an upper surface region and a bottom surface region, the bottom surface region comprising a first contact region and a second contact region, the first contact region being coupled to the second contact region through at least a third conduction path within an internal region of the component and extending from the first contact region to the second contact region; and
    a plurality of contact regions provided on one or more portions of the bottom surface region of the component and respectively coupled to a plurality of land patterns provided on one or more portions of the target platform; whereupon the first conduction path, third conduction path, and the second conduction path are configured in a serial manner to detect an alignment state between the plurality of contact regions to the plurality of land patterns.

14. The apparatus of claim 13 wherein the first conduction path, the third conduction path, and the second conduction path are configured in the serial manner and substantially horizontal.

15. The apparatus of claim 13 wherein the plurality of contact regions are coupled to the plurality of land patterns using a solderless component.

16. The apparatus of claim 13 wherein the plurality of contact regions are coupled to the plurality of land patterns using an ACE.

* * * * *